United States Patent

Karasawa et al.

[11] Patent Number: 6,121,062
[45] Date of Patent: Sep. 19, 2000

[54] PROCESS OF FABRICATING SEMICONDUCTOR UNIT EMPLOYING BUMPS TO BOND TWO COMPONENTS

[75] Inventors: Kazuaki Karasawa; Teru Nakanishi; Kaoru Hashimoto; Toshihiro Sakamura, all of Kawasaki, Japan

[73] Assignee: Fujitsu Limited, Kawasaki, Japan

[21] Appl. No.: 08/606,503

[22] Filed: Feb. 23, 1996

Related U.S. Application Data

[63] Continuation of application No. 08/237,173, May 3, 1994, abandoned.

[30] Foreign Application Priority Data

Aug. 13, 1993 [JP] Japan .................................. 5-201704

[51] Int. Cl.[7] .......................... H01L 21/66; H01L 21/44; H01L 21/48; G01R 31/26
[52] U.S. Cl. ........................... 438/15; 438/613; 438/615; 438/106; 228/180.22
[58] Field of Search ................................... 438/613, 614, 438/615, 616, 617, 15, 106

[56] References Cited

U.S. PATENT DOCUMENTS

| | | | |
|---|---|---|---|
| 4,752,027 | 6/1988 | Gschwend | 228/180.2 |
| 4,865,245 | 9/1989 | Schultz et al. | 228/116 |
| 4,912,545 | 3/1990 | Go | 357/67 |
| 4,974,769 | 12/1990 | Mizuishi . | |
| 5,022,580 | 6/1991 | Pedder | 228/56.3 |
| 5,056,215 | 10/1991 | Blanton | 29/840 |
| 5,071,787 | 12/1991 | Mori et al. | 437/183 |
| 5,125,560 | 6/1992 | Degani et al. | 228/223 |
| 5,276,289 | 1/1994 | Satoh et al. | 174/260 |
| 5,341,980 | 8/1994 | Nishikawa et al. | 228/205 |

FOREIGN PATENT DOCUMENTS

| | | |
|---|---|---|
| 0 147 576 | 7/1985 | European Pat. Off. . |
| 0 191 434 | 8/1986 | European Pat. Off. . |
| 0 358 867 | 3/1990 | European Pat. Off. . |
| 0 463 297 | 1/1992 | European Pat. Off. . |
| 57-056937 | 4/1982 | Japan . |
| 62-071908 | 4/1987 | Japan . |
| 62-71908 | 5/1987 | Japan . |
| 62-245640 | 10/1987 | Japan . |
| 62-276518 | 12/1987 | Japan . |
| 63289844 | 11/1988 | Japan . |
| 1-192126 | 8/1989 | Japan . |
| 1295433 | 11/1989 | Japan . |
| 237734 | 2/1990 | Japan . |
| 2172296 | 7/1990 | Japan . |
| 2-232946 | 9/1990 | Japan . |
| 2-303676 | 12/1990 | Japan . |
| 3-071649 | 3/1991 | Japan . |
| 3-138941 | 6/1991 | Japan . |
| 3-138942 | 6/1991 | Japan . |
| 3-171643 | 7/1991 | Japan . |

(List continued on next page.)

OTHER PUBLICATIONS

Partial Translation and Summary of JP02–172296, Scientific and Technical Information Center, Dec. 6, 1995.

*Primary Examiner*—David E. Graybill
*Attorney, Agent, or Firm*—Staas & Halsey LLP

[57] ABSTRACT

A bump forming step forms a predetermined number of bumps on at least a first one of two components. A height measuring step measures the heights of the predetermined number of bumps. A fixing step fixes the two components together by means of the bumps with the distance between the two components determined, using the result of the height measurement, so that all of the predetermined number of bumps should come in contact with the second one of the two components. An oxide-film removing step removes the oxide film formed on the predetermined number of bumps after the height measuring step and before the fixing step. The fixing step comprises a press fixing step for press fixing the two components at the above distance by means of a press fixing method, and a melting step for causing the bumps to melt in a predetermined atmosphere so that the bumps firmly join the two components together. The distance is established by at least one of the press fixing step and the melting step.

41 Claims, 6 Drawing Sheets

FOREIGN PATENT DOCUMENTS

| | | |
|---|---|---|
| 3-217024 | 9/1991 | Japan . |
| 3209734 | 9/1991 | Japan . |
| 3218645 | 9/1991 | Japan . |
| 437137 | 2/1992 | Japan . |
| 456246 | 2/1992 | Japan . |
| 4180232 | 6/1992 | Japan . |
| 4294542 | 10/1992 | Japan . |
| 4-328843 | 11/1992 | Japan . |
| 4328843 | 11/1992 | Japan . |
| 541381 | 2/1993 | Japan . |

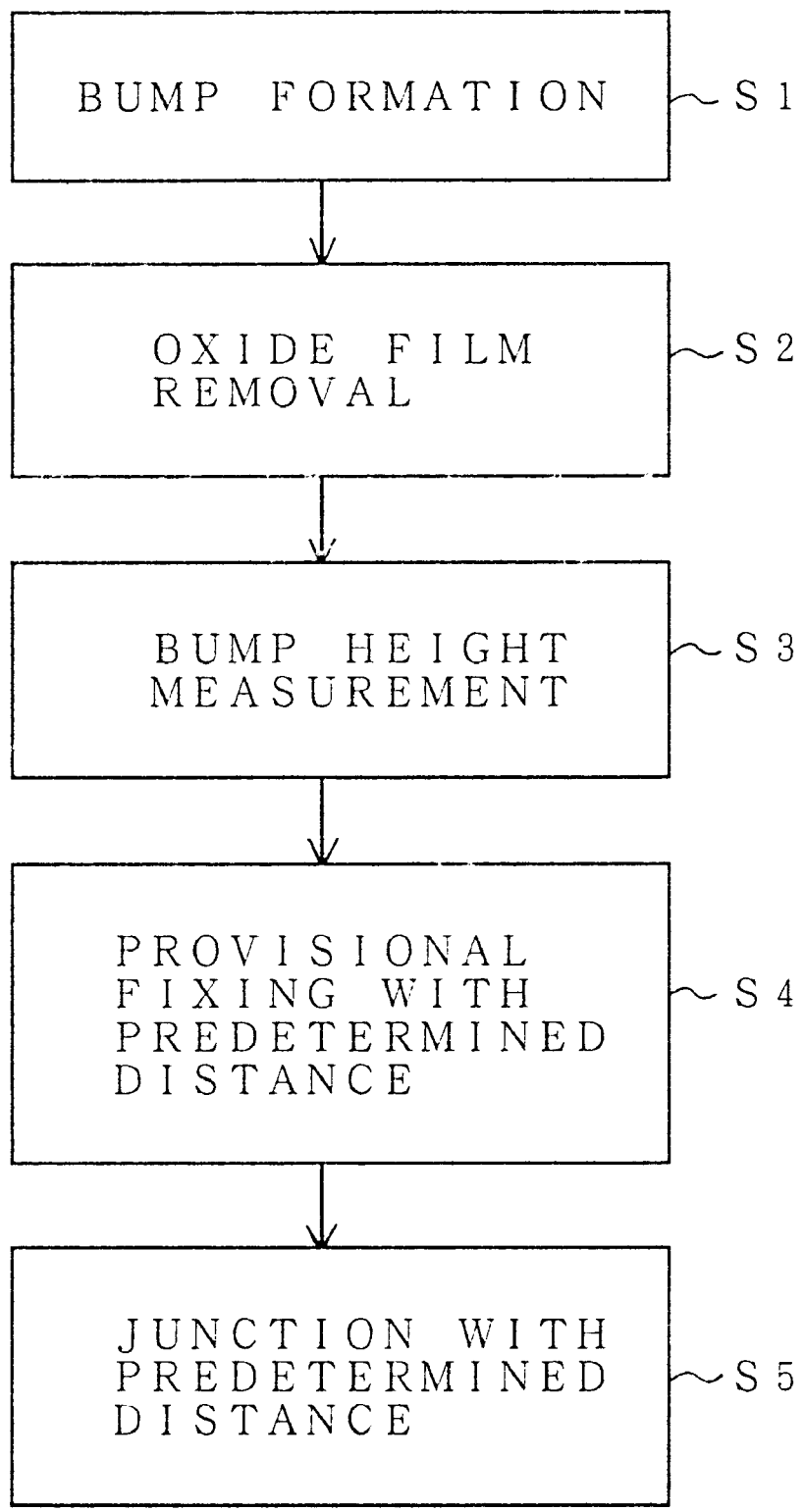

PROCESS OF FABRICATING SEMICONDUCTOR UNIT EMPLOYING BUMPS TO BOND TWO COMPONENTS

This application is a continuation, of application Ser. No. 08/237.173, filed May 3, 1994, now abandoned.

BACKGROUND OF THE INVENTION

1. Field of the Invention

The present invention relates to a process of fabricating a semiconductor unit employing a flip-chip function.

Recently, high-speed operation has been demanded of semiconductor units so that not only high-speed operation of semiconductor devices themselves but also shortening of circuit lengths between the semiconductor devices are required. For this purpose, miniaturization of semiconductor devices and narrowing of bonding pitches are needed. The shortening of the total circuit length may be achieved by soldering electronic devices to substrates using lead-less chip carriers (LCC) and flip chip bonding.

2. Related Art

In order to join an electronic device such as a semiconductor device onto a substrate, solder bumps are formed on at least a first one of the electronic device and the substrate. Then, the first one is positioned on the second one of the electronic device and the substrate so that the thus formed bumps may meet the corresponding electrodes provided on the second one. Then, the bumps are made to reflow so that the bumps join the electronic device onto the substrate. There, flux is used.

The flux acts to provisionally maintain the spatial relationship between the electronic device and the substrate by lying between the bumps and the second one of the electronic device and the substrate. The flux further acts to create sufficient wetting conditions between the solder bumps and the corresponding electrodes. The flux may cause problems as described below. The flux is cleaned away (i.e., removed) after the relevant bonding has been completed. If any residue of the flux is left after the cleaning, the active ingredients contained in the residue may cause corrosion there. Further, the toxicity of the flux may pollute the environment if the liquid waste produced in the above cleaning is discharged.

Further, the flux cleaning work for the relevant solder bonding may become difficult if the distances between the components or semiconductor devices and the substrates are made narrow so as to shorten the total circuit length. In particular, if the flip chip bonding is applied to the solder bonding, since the distance between the semiconductor device and the substrate to be joined together is thus short, the flux cleaning work is difficult and checking the effectiveness of the flux cleaning is also difficult.

On the other hand, omission of the flux application in the solder bonding process may result in poor bonding because of insufficient wetting conditions between the bumps and electrodes. Further, displacement positioning errors may occur between the electronic device and substrate during the period between the initial positioning process and the actual solder bonding process.

In order to achieve sufficient wetting conditions between the electronic device and substrate without using flux at the solder joining process, the following methods may be used, for example: before the solder joining process, oxide and hydroxide are removed from the bumps using flux, dry-etching, or the like, and then the solder joining is performed in an inert atmosphere. (See Japanese Laid-Open Patent Application No. 62-71908, Japanese Laid-Open Patent Application No. 62-276518, Japanese Laid-Open Patent Application No. 2-303676, Japanese Laid-Open Patent Application No. 3-138941, Japanese Laid-Open Patent Application No. 3-138942, and Japanese Laid-Open Patent Application No. 3-171643)

However, since no means, such as flux, is used to provisionally fix the electronic device onto the substrate, the above mentioned positioning errors may occur. Further, large-scale equipment is needed for removing oxide films formed on the solder bump surfaces by means of the dry-etching method.

In order to avoid the positioning errors without using the flux, a thermo-compression fixing method and a fixing method employing a soft metal or the like may be used. (See Japanese Laid-Open Patent Application No. 59-072795, Japanese Laid-Open Patent Application No. 62-245640, Japanese Laid-Open Patent Application No. 1-192126, Japanese Laid-Open Patent Application No. 2-232946, Japanese Laid-Open Patent Application No. 3-71649, Japanese Laid-Open Patent Application No. 3-171643, and Japanese Laid-Open Patent Application No. 3-217024.)

The provisional fixing of the electronic device and substrate may include problems such as are described below. If the respective heights of the solder bumps formed on the first one of the electronic device and substrate are different from one another, some bumps may not come into contact with the corresponding electrodes after the provisional fixing process has been performed. Also, if the respective heights of the bumps measured before the bonding process are less than the distance between the electronic device and substrate measured after the solder bonding process, there may have been a problem in the solder bonding process. In that case, the inspection work to find the problems appearing in both the provisional fixing process and the solder joining process is difficult. Thus, the reliability of the resulting semiconductor unit may be degraded.

SUMMARY OF THE INVENTION

An object of the present invention is to provide a semiconductor-unit fabrication process which enables improvement of the reliability of the resulting semiconductor unit even if the bump heights, as measured before the provisional fixing process, are different.

In order to achieve the above object of the present invention, a fabrication process according to the present invention includes steps as shown in FIG. 1. FIG. 1 shows a process of fabricating a semiconductor unit including bonding, employing a predetermined number of bumps, for joining an electronic device to a substrate. A step S1 (the term 'step' is omitted, hereinafter) forms the predetermined number of bumps on at least a first one of the electronic device and the substrate. S2 removes the oxide film produced on the surfaces of the thus formed bumps. S3 measures the heights of all the bumps. S4 provisionally fixes the electronic device onto the substrate using a press fixing method with the distance therebetween depending on the result of the height measurement performed in S3. S5 then causes the bumps to reflow in predetermined atmosphere at the above distance so that the electronic device is permanently fixed and joined to the substrate.

The performance of the above S3 and the application of the result of S3 to at least one of S4 and S5 may prevent problematic bonding due to the fact that the height difference among the bumps, appearing before the provisional fixing process, can be prevented from occurring. Thus, a reliable solder bonding result may be achieved. Further, since the press fixing is employed instead of the flux application for the provisional fixing, the above-described problems due to the flux residue may be eliminated. Thus, reliability of the relevant bonding may be improved and also the above mentioned environmental problem may be eliminated.

Other objects and further features of the present invention will become more apparent from the following detailed description when read in conjunction with the accompanying drawings.

BRIEF DESCRIPTION OF THE DRAWINGS

FIG. 1 shows a basic process of the present invention;

DESCRIPTION OF THE PREFERRED EMBODIMENTS

Figure 2A:
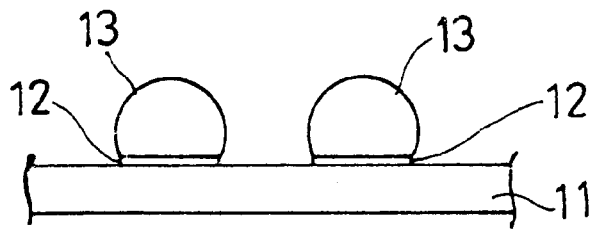
FIGS. 2A, 2B, 2C and 2D show fabrication process diagrams in a first embodiment of the present invention.

With regard to FIGS. 2A–2D, a fabrication process in a first embodiment of the present invention is now described. FIGS. 2A–2D show a part of a process of fabricating a semiconductor unit. In FIG. 2A, a semiconductor chip 11 of an electronic device includes a predetermined number of electrode pads 12, the predetermined number depending on the function to be provided by the semiconductor unit. Onto each of the electrode pads 12, a bump 13 is formed of Sn-95Pb solder, for example, using plating technology.

Then, the oxide films (which may comprise oxide and hydroxide) formed on the surfaces of the thus formed bumps 13 are removed.

Figure 3A:
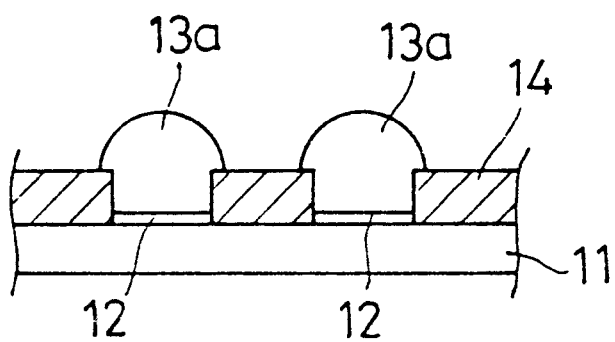
FIGS. 3A, 3B, 3C, 3D and 3E show fabrication process diagrams of bump formation and oxide film removal steps in any of the first embodiment and a second embodiment of the present invention.

With reference to FIGS. 3A–3E, the above bump formation and oxide film removal steps of FIG. 2A are now described. As shown in FIG. 3A, resist 14 is applied to the semiconductor chip 11 where the electrode pads 12 are to remain uncovered, by means of photo-lithography technology. Then, the above-mentioned Sn-95Pb solder is deposited on the exposed pads 12 using the plating technology so that the bumps 13a are formed.

Figure 3B:
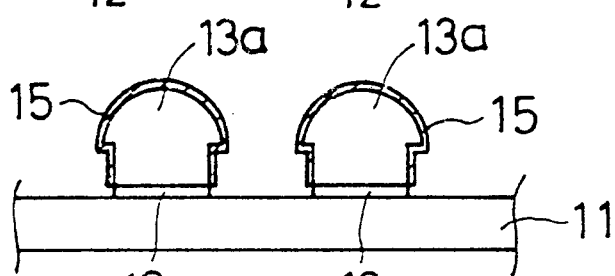

Then, as shown in FIG. 3B, after the resist 14 is removed, the bumps 13a are left. On the surfaces of the bumps 13a, the oxide films 15 of oxide or hydroxide are inevitably formed.

Figure 3C:
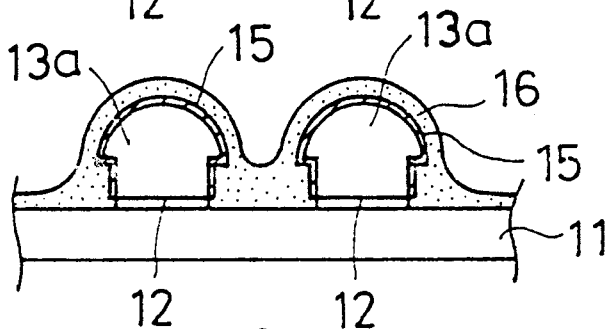
Figure 3D:
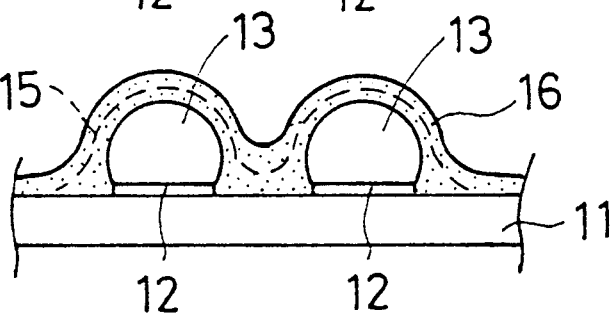

Then, as shown in FIG. 3C, flux 16 is applied to the semiconductor chip 11 and bumps 13a which are then heated to 350° C. in a non-oxidizing atmosphere. As a result, as shown in FIG. 3D, the bumps 13a melt accordingly so as to be transformed into the spherical bumps 13 and the oxide films 15 are dissolved into the flux 16.

Figure 3E:
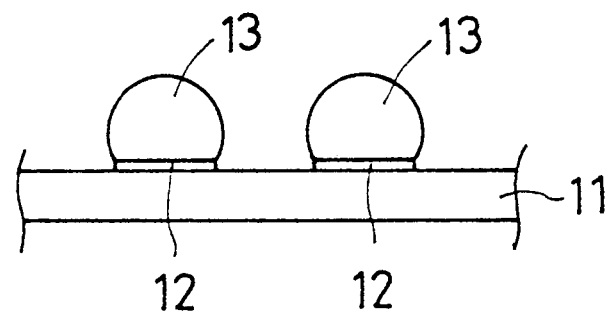

Then, when the resultant structure is cleaned by triclene (trichloroethylene) for example, the oxide films 15 are removed and thus are absent as shown in FIG. 3E, and the spherical bumps 13 are exposed. Actual dimensions and number of the bumps 13, for example, are as follows: when each side of the semiconductor chip measures more than 10 millimeters, the diameter of each bump 13 measures 10 μm, and the number of bumps 13 formed thereon amounts to several thousands on each semiconductor chip.

The bump formation step may also use deposition technology or another technology instead of the plating technology in the first embodiment of the present invention.

Figure 2B:
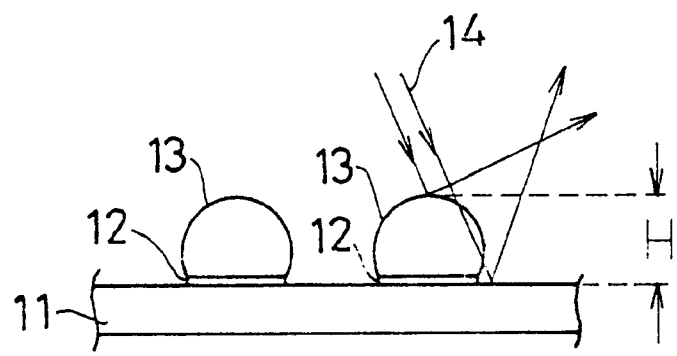
Figure 4:
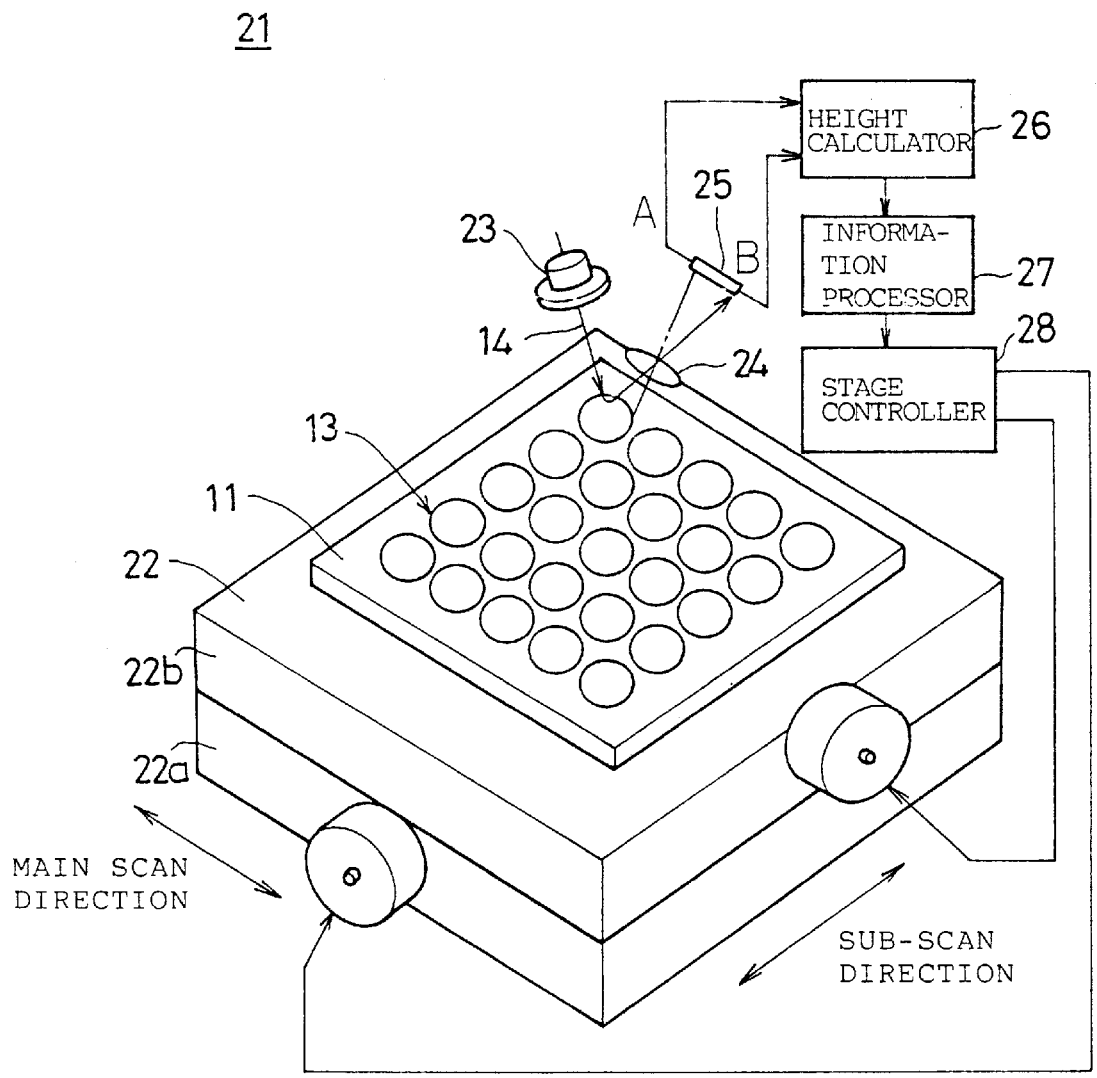
FIG. 4 shows bump-height measurement equipment to be used for a bump height measurement step in any of the first embodiment and second embodiment of the present invention.

Then all the heights H in FIG. 2B are measured by means of laser beams 14 and the triangulation principle as described below with reference to FIG. 4. The bump-height measurement equipment 21 is one example of equipment which may be used in the above bump-height measurement step. The semiconductor chip 11 on which the bumps 13 have been formed is placed on a two-axis stage 22. A LD (laser diode) 23 irradiates the bump electrodes 13 (same as the bumps 13) with the laser beams 14. The light beams reflected from the bumps 13 accordingly are made to converge at a detector 25 through an image-formation lens 24. According to the output of the detector 25, a height calculator 26 calculates the height of the relevant irradiated bump 13 and the calculation result is stored in an information processor 27. After one bump 13 has been measured, the information processor 27 operates the two-axis stage 22 (including a main scan stage 22a and sub-scan stage 22b) through a stage controller 28 so that the equipment 21 may measure the heights of the remaining bumps 13 successively.

The height calculation performed by the height calculator 26 is based on the generally used triangulation principle. That is, the height calculator 26 uses the signals A and B output from the detector 25 due to the light beams received thereby, the magnification of the image-formation lens 24 and irradiation angles of the laser beams 14. The property of the detector 25 made of a photo-diode, for example, has the effect that each of the above output signals A and B indicates a distance value (electric current, for example) inversely proportional to the distance between the position at which the light beam is currently incident on the detector 25 and an end thereof. The ratio between the distance values of the signals A and B leads to the above light-beam incident position on the detector. The height calculator 26 thus calculates the light-beam incident positions which are then used to calculate the height H of the bump 13 through the triangulation principle. The bump heights H are assumed be distributed in a range of 95 μm, through 115 μm for example.

Returning to the description according to the FIGS. 2A–2D process flow, in FIG. 2C, on the circuit substrate 17 to which the semiconductor chip 11 is to be joined, the electrodes 18 (of Au for example) were previously formed and which match the bumps 13 on the chip 11. Proper positioning of the chip 11 on the substrate 17 causes the bumps 13 to meet the respective electrodes 18. Then, a pressing mechanism 19 is used to press the chip 11 with a force of 3 kgf, for example, downwardly in FIG. 2C so as to provisionally fix the chip 11 onto the substrate 17. This pressing operation is performed to result in the bump height (space between the chip and substrate as shown in FIG. 2D) $L_1$ of 90 μm, in the above assumed case in which the bump heights H were previously distributed in a range of 95 μm through 115 μm. This provisional fixing step is preferably performed under the conditions of 250° C. ambient temperature for 3 minutes, that is, using the press fixing method. In the actual experiment performed according to the above procedure, the resulting chip and substrate provisional assembly does not cause any positioning errors to occur while the assembly is carried to a position where the subsequent solder bonding step is to be performed thereon.

Then, in the position in which the solder bonding step is to be performed, the assembly is heated to 400° C. ambient temperature in a $N_2(80\%)+H_2(20\%)$ atmosphere for 10 minutes, for example, without using flux (FIG. 2D). As a result, the bumps 13 melt so that the semiconductor chip 11 is joined (flip chip bonding) to the circuit substrate 17.

Figure 5:
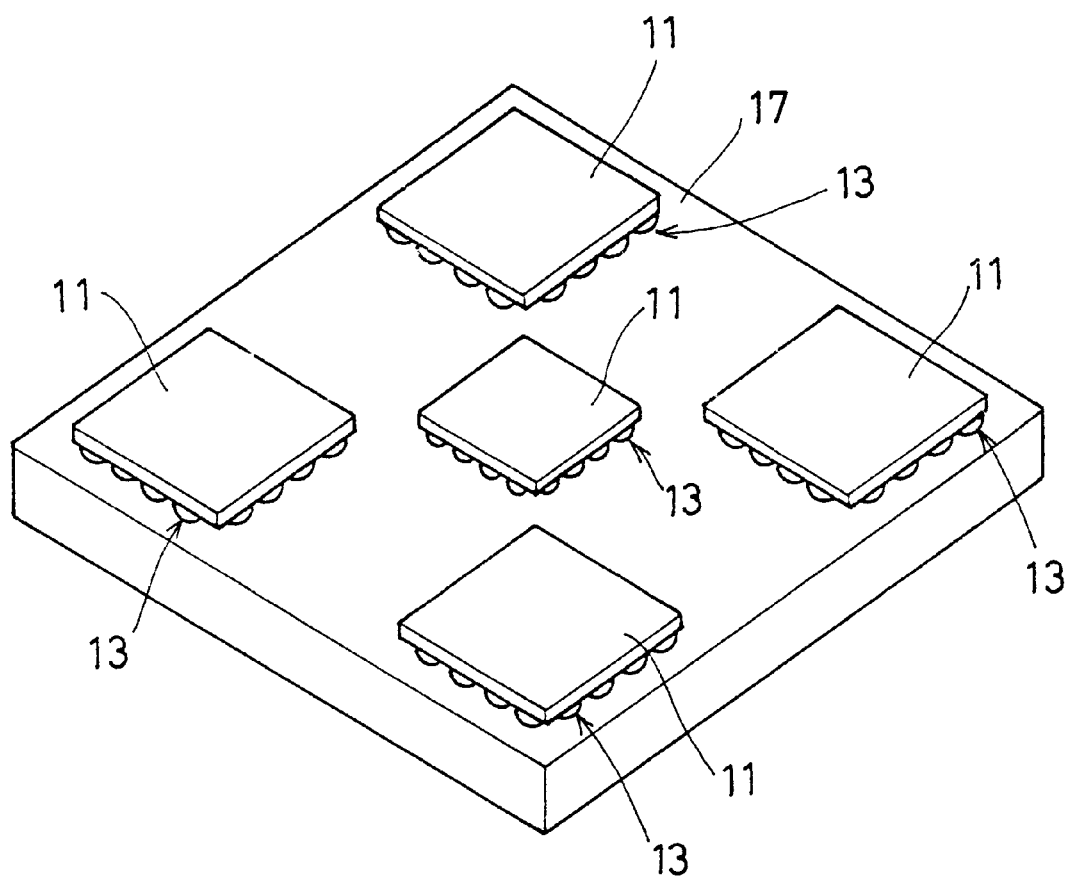
FIG. 5 shows a semiconductor unit employing flip chip bonding according to any of the first and second embodiments of the present invention.

Referring to FIG. 5, the flip-chip bonded semiconductor unit is now described. The state of the FIG. 5 unit is substantially identical to that shown in FIG. 2D but FIG. 5 shows a perspective view of the unit. As shown in the figure, as an example, five semiconductor chips 11 are bonded in the flip chip bonding manner on the circuit substrate 17 by means of the bumps 13.

Figure 2C:
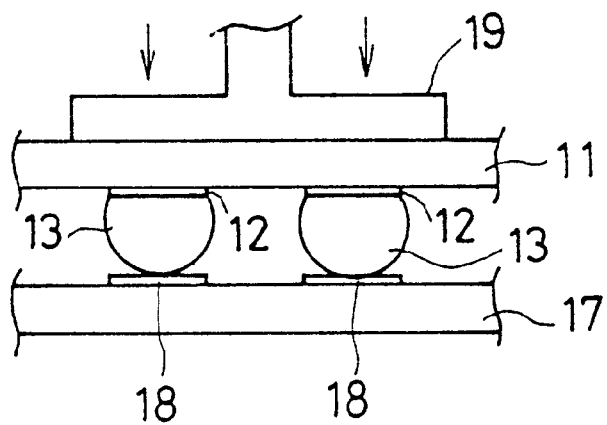
Figure 2D:
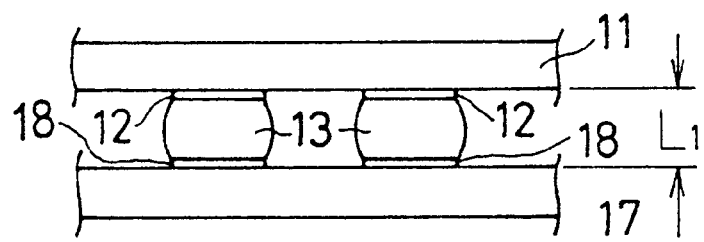

Even if the heights of the bumps of the chips 11 are different from one another before the chips are provisionally fixed on the substrate 17 as described above, all the bumps' free ends can be made to come in contact with the corresponding electrodes 18 on the circuit substrate 17 (see, FIG. 2C). This contact state can be achieved by making the bump heights, appearing after the provisional fixing step (using the press fixing method) is performed, be appropriately less than the bump heights before the step performed. As a result, sure bonding may be achieved. Further, removing of the oxide films 15 from the surfaces of the bumps 13 (13a) as described above provides sufficiently wetting conditions between the bumps' free ends and the electrodes 18 to be bonded together without using flux so that proper bonding may be achieved. Consequently, a reliable semiconductor unit may be obtained.

Figure 6A:
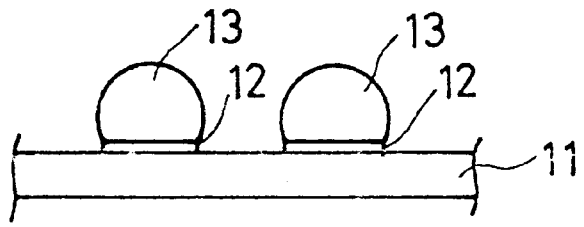
FIGS. 6A, 6B, 6C and 6D show fabrication process diagrams of a second embodiment of the present invention.
Figure 6B:
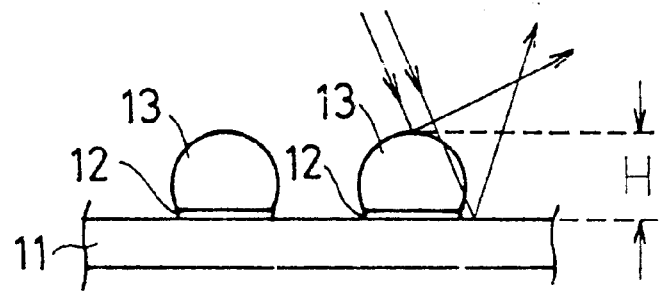

With reference to FIGS. 6A–6D, a fabrication process in a second embodiment of the present invention is now described. The steps associated with FIGS. 6A and 6B are respectively similar to those of FIGS. 2A and 2B and the construction of the circuit substrate 17, having the electrodes 18 provided thereon, is similar to that used in the process of FIGS. 2A–2D. Thus, the relevant description is omitted. If In solder is used instead of the above-mentioned Sn-95Pb solder for forming the bumps 13, the heights of the bumps 13 are made to be distributed in a range of 50 μm through 70 μm, for example, measured as described above using measurement equipment such as that of the above mentioned equipment 21.

Figure 6C:
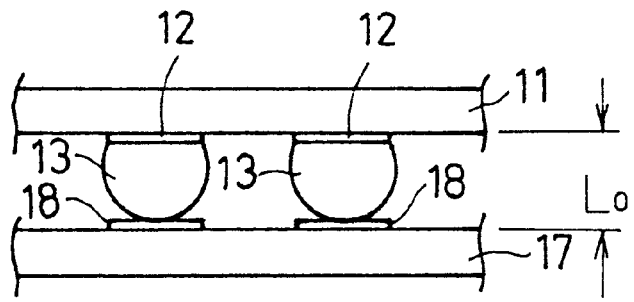

Then, in FIG. 6C, the bumps 13 thus formed on the electrode pads 12 previously prepared on the semiconductor chip 11 are made to respectively meet the corresponding electrodes 18 prepared on the circuit substrate 17 by positioning them properly. Then, using the viscosity of the In in the bumps 13, the bumps' free ends are made to be press fixed on the electrodes 18 at the normal ambient temperature. The press fixing is performed so that the resulting distance $L_0$, shown in FIG. 6C between the chip 11 and substrate 17, may measure 60 μm in the above case that the previously measured bump heights have been distributed between 50 μm through 70 μm. Thus, the provisional fixing of the semiconductor chip 11 and the circuit substrate 17 has been performed. In the actual experiment performed according to the above procedure, the resulting chip and substrate provisional assembly does not cause any positioning errors to occur while the assembly is carried to a position where the subsequent solder bonding step is to be performed thereon.

Figure 6D:
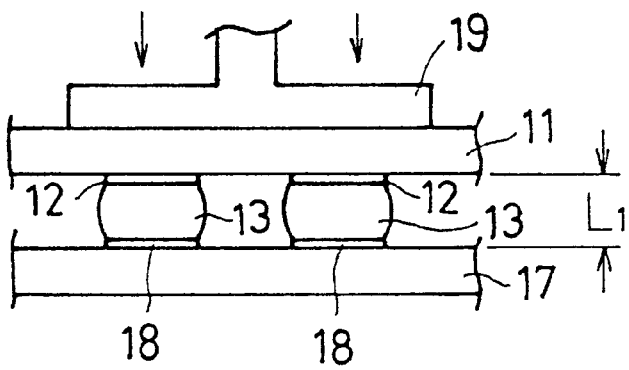

Then, in the position where the solder bonding step is performed, the assembly is heated to 260° C. ambient temperature in a $N_2(80\%)+H_2(20\%)$ atmosphere for 10 minutes, while the pressing mechanism 19 applies a force of 20 gf onto the chip 11 downwardly as shown in FIG. 6D, in the In-bump applied case without using the flux. As a result, the bumps 13 melt so that the semiconductor chip 11 is joined in the solder bonding manner to the circuit substrate 17 with the space (at the distance) $L_1$=40 μm in this case. As a result, all the bumps' (13) free ends should be firmly joined to the corresponding electrodes 18 without any poor bonding occurring.

Thus, even if the respective heights of the bumps of the hips 11 are different from one another before the chips are provisionally fixed on the substrate 17, as described above, all the bumps' free ends can be made to come in contact with the corresponding electrodes 18 on the circuit substrate 17. This contact state can be achieved by making the bump heights, appearing after the solder bonding step is performed (under control by means of the pressing mechanism), properly lower than the bump heights before the step is performed. As a result, the sure bonding may be achieved. Consequently, a reliable semiconductor unit may be obtained.

The above described oxide-film (on the bumps 13) removal step is not limited to that using the flux in the above embodiments but another method using ion-etching or the like may also be applied. Also, the bump formation step is not limited to that employing the Sn-95Pb or In solder for the bumps 13 in the above embodiments but another method employing an alloy including In, Pb, Sn, Bi, Ag, Ga or the like may be applied.

Further, the above provisional fixing step may further comprise forming dummy electrode pads and bumps on the semiconductor chip 11 and forming dummy electrodes at the matching positions on the circuit substrate 17. The dummy electrode pads, bumps and dummy electrodes are produced at vacant positions, and are used only for provisionally fixing the semiconductor chip 11 to the circuit substrate 17 and not for establishing any actual electrical circuits. The solder bonding step may comprise using VPS (vapor phase soldering) technology. The bumps 13 may be formed on the circuit substrate 17 instead of on the semiconductor chip 11 as described above.

Further, the present invention is not limited to the above described embodiments, and variations and modifications may be made without departing from the scope of the present invention.

What is claimed is:

1. A semiconductor-unit fabrication method, comprising the steps of:

a) forming a plurality of bumps on a main surface of a first one of two components, each bump having a respective height relative to the main surface;

b) measuring the respective heights of said bumps, each measured as a distance in standard units from the main surface; and c) positioning said two components, with said bumps therebetween and at a distance between said two components equal to or greater than a maximum height of the respective heights of the bumps measured in said step b), and applying a force acting to reduce the distance between the two components to a selected, first distance and thereby to reduce the respective heights of the bumps to intermediate the maximum and minimum measured bump heights, press fixing the two components together; and d) while maintaining a second selected distance between the two components, at which the bumps are all reduced to a second selected height less than the minimum of the bump heights measured prior to the press fixing step, melting the bumps so as to cause the bumps to reflow and thereby bond the two components together.

2. The semiconductor-unit fabrication method according to claim 1, which further comprises the steps of:
   d) removing an oxide film on said bumps after said step a) and before said step c); and
   said step c) further comprises:
   c1) provisionally fixing said two components relatively to each other, and
   c2) melting said bumps to bond said two components together; and
   said respective heights of said bumps are changed by at least one of said step c1) and said step c2).

3. The semiconductor-unit fabrication method according to claim 1, wherein said two components comprise a substrate and an electronic device.

4. The semiconductor-unit fabrication method according to claim 1, wherein said step c) sets said distance by moving at least one of said two components relatively to a common reference so that said two components close upon each other.

5. The semiconductor-unit fabrication method according to claim 1, wherein:
   said step b) measures a minimum height of said bumps; and
   said step c) sets said distance to a value less than said minimum height.

6. The semiconductor-unit fabrication method according to claim 1, wherein said step c), further, reduces said heights of said bumps by controlling an amount of energy applied to said bumps.

7. The semiconductor-unit fabrication method according to claim 6, wherein said step c) further comprises controlling a temperature of an atmosphere under which said two components are connected and a time during which said two components are placed under said atmosphere.

8. The semiconductor-unit fabrication method according to claim 7, wherein said atmosphere is a non-oxidizing atmosphere.

9. The semiconductor-unit fabrication method according to claim 7, wherein said step c) further comprises controlling a pressure of said atmosphere.

10. The semiconductor-unit fabrication method according to claim 1, wherein said bumps are made of a material selected from the group consisting of Sn-95Pb, In, and alloys of In, Pb, Sn, Bi, Ag or Ga.

11. The semiconductor-unit fabrication method according to claim 2, wherein said step e) uses flux to remove the oxide film.

12. A method of fabricating a semiconductor unit which comprises first and second components to be interconnected, comprising the steps of:
   (a) forming a plurality of bumps on respective selected locations defined on a main surface of the first component, the second component having locations thereon corresponding to the selected locations of the first component and to be interconnected therewith by the respective bumps;
   (b) measuring the respective, original heights of said plurality of bumps as formed on the first component, relative to the main surface thereof and in standard units, and determining a minimum height of the measured, original bump heights;
   (c) positioning the second component so as to align the locations thereof with the corresponding locations of the first component and to engage the respective bumps, as thereby disposed therebetween, the first and second components being displaced by a first distance substantially defined by original heights of respective bumps which exceed the minimum height of the measured original bump heights;
   (d) press fixing the first and second components together to establish a second distance therebetween, less than the first distance and equal to or less than the minimum height of the measured, original bump heights, the press fixing step (d) reducing the respective heights of any of the plurality of bumps having original heights greater than the minimum height of the measured, original bump heights in accordance with establishing the spacing of the second distance between the first and second components; and
   (e) while maintaining the spacing of the second distance between the first and second components, performing a solder bonding step thereby to melt the bumps and to interconnect the first and second components.

13. A method as recited in claim 12, wherein the respective locations on the first and second components comprise respectively corresponding electrodes and the bumps comprise a solder material, the method further comprising:
   performing the press fixing step (d) at an ambient temperature of approximately 250° C. with an applied press fitting force of approximately 3 Kgf for approximately 3 minutes; and
   performing the solder bonding step (e) by heating the two components with the bumps press fitted therebetween at an ambient temperature of 400° C. for approximately 10 minutes.

14. A method as recited in claim 13, further comprising performing the solder bonding step (e) in an atmosphere comprising a mixture of nitrogen and hydrogen.

15. A method as recited in claim 13, wherein the solder material of the bumps comprises Sn-95Pb solder.

16. A method as recited in claim 12, wherein the plurality of bumps formed in the bump forming step (a) have respective, original heights in a range of from approximately 95 $\mu$m to 115 $\mu$m.

17. A method as recited in claim 16, wherein the press fixing step (d) reduces the heights of the bumps to a substantially common height of 90 $\mu$m.

18. A method of fabricating a semiconductor unit which comprises first and second components to be interconnected, comprising the steps of:
   (a) forming a plurality of bumps on respective, selected locations defined on the first component, the second component having locations thereon corresponding to the selected locations of the first component and to be interconnected therewith by the respective bumps;
   (b) measuring the original, respective heights of said plurality of bumps and determining a range of the measured, original bump heights, from a minimum measured height to a maximum measured height;
   (c) positioning the second component so as to align the locations thereof with the corresponding locations of the first component and to engage the respective bumps as thereby disposed therebetween, the first and second components being displaced by a first distance substantially defined by the maximum measured original bump height and which exceeds the minimum height of the measured original bump heights, the first component being disposed vertically above the second component and the first component having a weight providing a corresponding press fixing force reducing a distance between the first and second components from the first distance to a second, smaller distance intermediate the range of the measured, original bump heights; and (d) performing compression bonding, at room temperature and under a controlled compression force, so as to melt the bumps and reduce the spacing between the first and second components to a third distance, less than the minimum measured bump height of the measured, original bump heights, and thereby to interconnect the first and second components.

19. A method as recited in claim 18, wherein the solder bumps comprise In material.

20. A method as recited in claim 19, further comprising performing the compression-bonding step (d) while applying a controlled force of 20 gf.

21. A method as recited in claim 20, wherein the compression bonding step (d) is performed at an ambient temperature of approximately 260° C. with the controlled force of approximately 20 gf for approximately ten minutes.

22. A method as recited in claim 18 wherein, for bump heights in the range of from 50 μm to 70 μm, the second, smaller distance, intermediate the range of the measured, original bump heights, is approximately 60 μm and the third distance is approximately 40 μm.

23. The semiconductor-unit fabrication method according to claim 1, wherein the step of measuring is performed using a triangulation principle.

24. The semiconductor-unit fabrication method according to claim 1, wherein the step of measuring is performed using height measuring equipment.

25. The semiconductor-unit fabrication method according to claim 12, wherein the step of measuring is performed using a triangulation principle.

26. The semiconductor-unit fabrication method according to claim 12, wherein the step of measuring is performed using height measuring equipment.

27. The semiconductor-unit fabrication method according to claim 18, wherein the step of measuring is performed using a triangulation principle.

28. The semiconductor-unit fabrication method according to claim 18, wherein the step of measuring is performed using height measuring equipment.

29. A semiconductor-unit fabrication method as recited in claim 1, wherein:
   each of steps (c) and (d) is performed using a pressing mechanism;
   step (c) further comprises controlling the pressing mechanism to selectively apply a force between the two components thereby to reduce the distance therebetween to a first selected distance which is less than the minimum measured bump height; and
   step (d) further comprises controlling the pressing mechanism so as to maintain the first selected distance as the second selected distance while melting and reflowing the bumps.

30. A semiconductor-unit fabrication method as recited in claim 1, wherein:
   each of steps (c) and (d) is performed using a pressing mechanism;
   step (c) further comprises controlling the pressing mechanism to selectively apply a force between the two components to reduce the distance therebetween to a first selected distance, intermediate the minimum and maximum measured bump heights, so that the heights of some but not all of the bumps are reduced thereby press fixing the two components together; and
   step (d) further comprises controlling the pressing mechanism so as to reduce the distance between the components to a second selected distance which is less than the minimum measured bump height, while melting the bumps so as to cause the bumps to reflow and thereby bond the two compounds together.

31. A semiconductor-unit fabrication method as recited in claim 1, wherein:
   step (c) is performed without using any spacing element between the two components for establishing the first selected distance.

32. A semiconductor-unit fabrication method as recited in claim 1, wherein:
   step (d) is performed without using any spacing element, disposed in a space between the two components, for establishing the second selected distance.

33. A semiconductor-unit fabrication method as recited in claim 32, wherein:
   step (c) is performed without using any spacing element, disposed in a space between the two components, for establishing the second selected distance.

34. A semiconductor-unit fabrication method, comprising the steps of:
   a) forming a plurality of bumps on a main surface of a first one of two components, each bump having a respective height relative to the main surface;
   b) measuring the respective heights of said bumps, each as a distance from the main surface;
   c) positioning said two components, with said bumps therebetween, in a pressing mechanism and controlling the pressing mechanism to apply a force acting to reduce the distance between the two components to a first selected distance which is less than the minimum measured bump height and thereby press fixing the two components together; and
   d) controlling the pressing mechanism so as to maintain the first selected distance while melting and reflowing the bumps.

35. A semiconductor-unit fabrication method as recited in claim 34, wherein:
   step (c) is performed without using any spacing element between the two components for establishing the first selected distance.

36. A semiconductor-unit fabrication method as recited in claim 34, wherein:
   step (d) is performed without using any spacing element, disposed in a space between the two components, for establishing the second selected distance.

37. A semiconductor-unit fabrication method as recited in claim 36, wherein:
   step (d) is performed without using any spacing element, disposed in a space between the two components, for establishing the second selected distance.

38. A semiconductor-unit fabrication method, comprising the steps of:
   a) forming a plurality of bumps on a main surface of a first one of two components, each bump having a respective height relative to the main surface;

b) measuring the respective heights of said bumps, each as a distance from the main surface;

c) positioning said two components, with said bumps therebetween, in a pressing mechanism and controlling the pressing mechanism to apply a force acting to reduce the distance between the two components to a first selected distance, intermediate the minimum and maximum measured bump heights, reducing the heights of some but not all of the bumps and thereby press fixing the two components together; and d) further controlling the pressing mechanism so as to further reduce the distance between the components to a second selected distance which is less than the minimum measured bump height, and melting the bumps so as to cause the bumps to reflow and thereby bond the two components together.

39. A semiconductor-unit fabrication method as recited in claim 38, wherein:

step (c) is performed without using any spacing element between the two components for establishing the first selected distance.

40. A semiconductor-unit fabrication method as recited in claim 38, wherein:

step (d) is performed without using any spacing element, disposed in a space between the two components, for establishing the second selected distance.

41. A semiconductor-unit fabrication method as recited in claim 40, wherein:

step (c) is performed without using any spacing element, disposed in a space between the two components, for establishing the second selected distance.

* * * * *

UNITED STATES PATENT AND TRADEMARK OFFICE
CERTIFICATE OF CORRECTION

PATENT NO. : 6,121,062
DATED : September 19, 2000
INVENTOR(S) : Kazuaki KARASAWA et al.

It is certified that error appears in the above-identified patent and that said Letters Patent is hereby corrected as shown below:

Col. 7, line 3, change "d)" to --e)--;
line 4, change "; and" to --.--;
lines 5-11, delete in their entirety.

Col. 8, lines 6-7, change "the press fixing step (d)" to --and, further,--;
line 8, delete ",";
line 10, change "heights" to --height--;
line 23, change "fitting" to --fixing--;
line 46, after "on" insert --a main surface of--;
line 51, after "bumps" insert --, relative to the main surface of the first component and in standard units,--;
line 63, change "the first component having a weight providing to --applying--;
line 64, delete "corresponding".

Signed and Sealed this

First Day of May, 2001

Attest:

NICHOLAS P. GODICI

*Attesting Officer*    *Acting Director of the United States Patent and Trademark Office*